US006379577B2

(12) United States Patent
Akatsu et al.

(10) Patent No.: US 6,379,577 B2
(45) Date of Patent: Apr. 30, 2002

(54) HYDROGEN PEROXIDE AND ACID ETCHANT FOR A WET ETCH PROCESS

(75) Inventors: Hiroyuki Akatsu, Yorktown Heights; David E. Kotecki, Hopewell Junction; Jingyu Jenny Lian, Wallkill; Hua Shen, Beacon, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/329,894

(22) Filed: Jun. 10, 1999

(51) Int. Cl.[7] .............................................. H01L 21/302

(52) U.S. Cl. ........................... 216/108; 216/41; 216/95; 216/100; 438/754

(58) Field of Search .............................. 216/41, 83, 95, 216/96, 99, 100, 108; 438/754; 252/79.1, 79.2

(56) References Cited

U.S. PATENT DOCUMENTS

| | | | | | |
|---|---|---|---|---|---|
| 4,759,823 | A | | 7/1988 | Asselanis et al. | 156/659.1 |
| 5,258,093 | A | * | 11/1993 | Maniar | 156/626 |
| 5,318,927 | A | | 6/1994 | Sandhu et al. | 437/225 |
| 5,374,330 | A | | 12/1994 | Douglas | 156/635 |
| 5,653,851 | A | | 8/1997 | Shelton | 216/67 |
| 5,698,869 | A | | 12/1997 | Yoshimi et al. | 257/192 |
| 5,712,168 | A | * | 1/1998 | Schmidt et al. | 436/135 |
| 5,759,437 | A | * | 6/1998 | Datta et al. | 252/79.1 |
| 5,817,552 | A | | 10/1998 | Roesner et al. | 438/241 |
| 5,868,948 | A | * | 2/1999 | Fujii et al. | 216/2 |
| 5,980,775 | A | * | 11/1999 | Grumbine et al. | 252/79.1 |
| 6,033,596 | A | * | 2/2000 | Kaufman et al. | 252/79.1 |
| 6,068,787 | A | * | 5/2000 | Grumbine et al. | 252/79.1 |
| 6,117,790 | A | * | 9/2000 | Schafer et al. | 438/712 |
| 6,177,351 | B1 | * | 1/2001 | Beratan et al. | 438/694 |
| 6,184,066 | B1 | * | 2/2001 | Chino et al. | 438/118 |
| 6,194,755 | B1 | * | 2/2001 | Gambino et al. | 257/301 |

FOREIGN PATENT DOCUMENTS

| | | |
|---|---|---|
| EP | 0 685 573 A1 | 4/1995 |
| JP | 07057967 A | 8/1993 |
| JP | 08310887 | 5/1995 |

OTHER PUBLICATIONS

W. Kern, Handbook of Semiconductor Wafer Cleaning Technology: Science, Technololgy, and Applications, pp. 17–21, 1993.*

* cited by examiner

*Primary Examiner*—Randy Gulakowski
*Assistant Examiner*—Jiri F. Smetana
(74) *Attorney, Agent, or Firm*—Wood, Phillips, VanSanten Clark & Mortimer

(57) ABSTRACT

A process and solution for selectively wet etching a titanium based perovskite material disposed on a silicon oxide or silicon nitride substrate is disclosed herein. The solution is composed of hydrogen peroxide, an acid and deionized water. The solution is heated to a temperature between 25 and 90 degrees Celsius. The titanium based perovskite material may be barium strontium titanate, barium titanate, strontium titanate or a lead titanate. The solution selectively etches the perovskite material while the substrate is only minimally etched, if at all. The process and solution allows for an etching rate up to thirty times greater than conventional etching rates for similar perovskite materials selective to various substrate, barrier and mask layers, including $SiO_2$.

12 Claims, 6 Drawing Sheets

| | | BSTO : TiN : $SiO_2$ | | | |
|---|---|---|---|---|---|
| $H_2SO_4:H_2O_2$:DI | 30°C | 40°C | 50°C | 60°C | 70°C |
| 10 : 45 : 45 | 1:2.7:0.8 | 1:0.4:0.2 (6.5:3:1) | 1:0.4:0 (2.4:1:0) | 1:0.6:0 (1.5:1:0) | 1:0.3:0 (>3:1:0) |

HYDROGEN PEROXIDE AND ACID ETCHANT FOR A WET ETCH PROCESS

FIELD OF THE INVENTION

The present invention relates to a process for etching a ferroelectric film disposed on a substrate. More specifically, the present invention relates to a process and solution for wet etching a perovskite material disposed on a silicon substrate.

BACKGROUND OF THE INVENTION

Ferroelectric films have been actively utilized for electronic and optoelectronic applications such as memory devices, transistors and optical devices. Many perovskite ferroelectric materials are notable as advanced dynamic random access memory ("DRAM") capacitors for the one gigabit and beyond range. These perovskite materials include barium titanate, $BaTiO_3$ ("BTO"), strontium titanate, $SrTiO_3$ ("STO"), and their solid solutions, barium strontium titanate, $(Ba,Sr)TiO_3$ ("BSTO"). BSTO is especially useful in electrical and optoelectrical devices because of its lower leakage current and better aging properties.

A common structure employed in DRAM devices is a stacked cell structure, in which a BSTO capacitor is connected to a pass transistor via a poly silicon contact plug. Platinum is generally used as the bottom electrode for the capacitor. The platinum is placed on a silicon oxide or silicon nitride substrate and a contact plug. Platinum is utilized since the bottom electrode must endure a high temperature oxygen environment during the deposition of the perovskite material. Additionally, to avoid an undesirable reaction between the platinum electrode and the silicon substrate, one or more diffusion barrier layers may be juxtaposed between the platinum electrode layer and the silicon oxide or silicon nitride substrate and the contact plug. The bottom electrode is patterned and a ferroelectric perovskite material such as BSTO is deposited onto the bottom electrode and the field region that does not contain bottom platinum. Then a top electrode is deposited onto the ferroelectric perovskite material. A cover and mask layer may be placed onto the top electrode layer. Such a stacked cell structure may be fabricated using established patterning technologies. Such patterning technologies involve the etching of various layers of the stacked cell structure to expose other layers for proper functioning of the electronic device. Dry or wet etching techniques may be employed to fabricate the finished stacked cell structure.

One known etchant for BSTO is hydrogen fluoride. Although hydrogen fluoride is an adequate etchant for BSTO, it has the detrimental effect of etching exposed silicon and oxide surfaces. Thus, the use of hydrogen fluoride to etch a BSTO layer of a stacked cell structure would result in other layers being etched thereby possibly damaging the electronic device.

Another etchant that may attack the titanate bonds of a perovskite lattice is hydrogen peroxide. The hydrogen peroxide forms a strong complex with the titanium. However, the etch rate of BSTO in hydrogen peroxide is extremely slow, well below even the lowest possible commercial production rate. Thus, the use of hydrogen peroxide would substantially increase the production costs of the electronic device.

Other etchants include hydrochloric acid, see U.S. Pat. Nos. 5,374,330 and 5,356,516, illuminated with radiation. Illumination is required for etching titanates (such as BSTO) in the HCl acid liquid ambient, which increases production costs.

The present invention is directed to solving one or more of the problems discussed above in a novel manner.

SUMMARY OF THE INVENTION

The present invention provides a solution to the problems of the prior art associated with the fabrication of DRAM devices and other electronic devices. The present invention is able to accomplish this by providing a process and solution for wet etching of ferroelectric films at a commercially acceptable rate of production.

One aspect of the present invention is a process for etching a perovskite ferroelectric material. The process includes providing a substrate having a ferroelectric film. The ferroelectric film is composed of a perovskite material. The process also includes subjecting the ferroelectric film to a mixture of hydrogen peroxide and an acid. The process also includes heating the mixture to a temperature between 30 and 90 degrees Celsius.

The perovskite material of the process may be barium strontium titanate, barium titanate, strontium titanate, calcium titanate, lead titanate, lead lanthanum zirconium titanate or lead zirconium titanate. The acid of the process may be sulfuric acid, hydrochloric acid, phosphoric acid, acetic acid or the like. The mixture may be composed of between approximately 20% to approximately 95% of hydrogen peroxide, 5% to 80% acid, and 0% to 75% deionized water.

More specifically, the mixture of the process may be composed of approximately 45 percent hydrogen peroxide, approximately 10 percent acid and approximately 45 percent deionized water.

The step of subjecting the ferroelectric film to the mixture may include placing the substrate with the ferroelectric film disposed thereon into a solution of the mixture for a predetermined time period to effect the necessary etching of the ferroelectric film. The predetermined time period may be between 30 and 1000 seconds or longer.

Another aspect of the present invention is a process for etching a perovskite ferroelectric material which includes providing a substrate having a ferroelectric film composed of a barium strontium titanate, barium titanate, strontium titanate or a lead titanate. The substrate also has a silicon oxide or silicon nitride component and an electrode. The process also includes subjecting the substrate having the ferroelectric film to a solution of hydrogen peroxide and an acid. The process also includes heating the solution to a temperature between 25 and 90 degrees Celsius.

The electrode of the process may be composed of platinum. The acid of the process may be sulfuric acid. The solution of the process may be composed of between approximately 20% to approximately 95% of hydrogen peroxide, 5% to 80% acid, and 0% to 75% deionized water. The solution of the process may be heated to a temperature between 30 and 70 degrees Celsius. The step of subjecting the substrate having a ferroelectric film to the solution may include placing the substrate having the ferroelectric film into a bath of the solution for a predetermined time period to effect the necessary etching of the ferroelectric film. The predetermined time period may be between 30 and 240 seconds.

Another aspect of the present invention is in a solution for a wet etch process for selective removal of a titanium based perovskite material. The solution consists essentially of hydrogen peroxide which forms a complex with the titanium of the titanium based perovskite material, an acid capable of stabilizing the complex formed between the hydrogen peroxide and the titanium, and optionally deionized water.

The solution may be composed of between approximately 20% to approximately 95% of hydrogen peroxide, 5% to 80% acid, and 0% to 75% deionized water. The acid of the solution may be sulfuric acid. The solution may be heated to a temperature of between 25 and 90 degrees Celsius. The titanium based perovskite material of the solution may be barium strontium titanate, barium titanate, strontium titanate or lead titanate. The solution may etch silicon oxide at a rate of less than 10 Angstroms per minute at a temperature of between 30 and 70 degrees Celsius.

Having briefly described the present invention, the above and further objects, features and advantages thereof will be recognized by those skilled in the pertinent art from the following detailed description of the invention when taken in conjunction with the accompanying drawings.

DETAILED DESCRIPTION OF THE INVENTION

The present invention is a process and solution for selectively wet etching a ferroelectric perovskite material. The process and solution is generally directed at the fabrication of cell stacked structures for electronic and optoelectronic devices, however, those skilled in the pertinent art will recognize the ability to practice the present invention for the fabrication of other devices without departing from the scope and spirit of the claims of the present invention.

The ferroelectric perovskite material is titanium based, and more specifically is composed of titanate. Such ferroelectric perovskite materials include barium strontium titanate, barium titanate, strontium titanate, calcium titanate, lead titanate, lead lanthanum zirconium titanate and lead zirconium titanate. The ferroelectric perovskite material is usually a single film layer of a multiple layer integrated circuit such as a DRAM device. The other layers will usually include silicon, a silicon oxide or a silicon nitride substrate, polystalline silicon, a bottom and a top electrode (generally platinum) and a cover and mask layer for the top electrode layer which can be composed of titanium nitride. Thus, in order to selectively etch the ferroelectric perovskite material, the solution of the present invention is unreactive to, or does not etch, the other components of the multiple layer integrated circuit.

The solution of the wet etch process of the present invention consists essentially of hydrogen peroxide, an acid and optionally deionized water. All references to percent concentration as used herein refer to volume percentages. The hydrogen peroxide is present in the solution from between 20% to 95% concentration. The acid is present from about 5% to 80% concentration. The deionized is present from 0% to 75%. The acid is preferably sulfuric acid ($H_2SO_4$). However, the acid may range from hydrochloric acid (HCl) to phosphoric acid ($H_3PO_4$). Another acid within the range is acetic acid ($CH_3COOH$).

Figure 1:
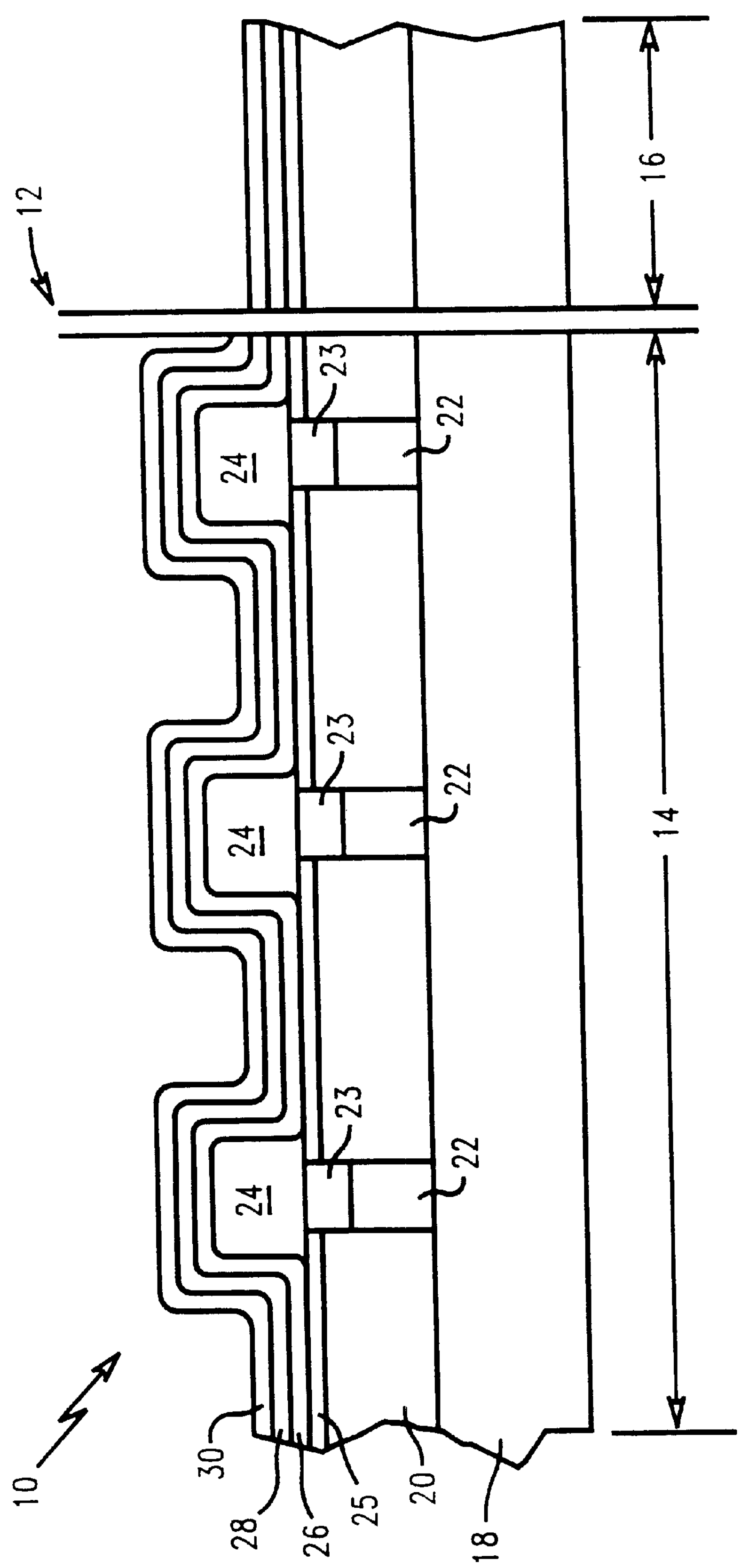
FIG. 1 is a cross-sectional view of a precursor of a cell stacked structure prior to etching of the top electrode.
Figure 2:
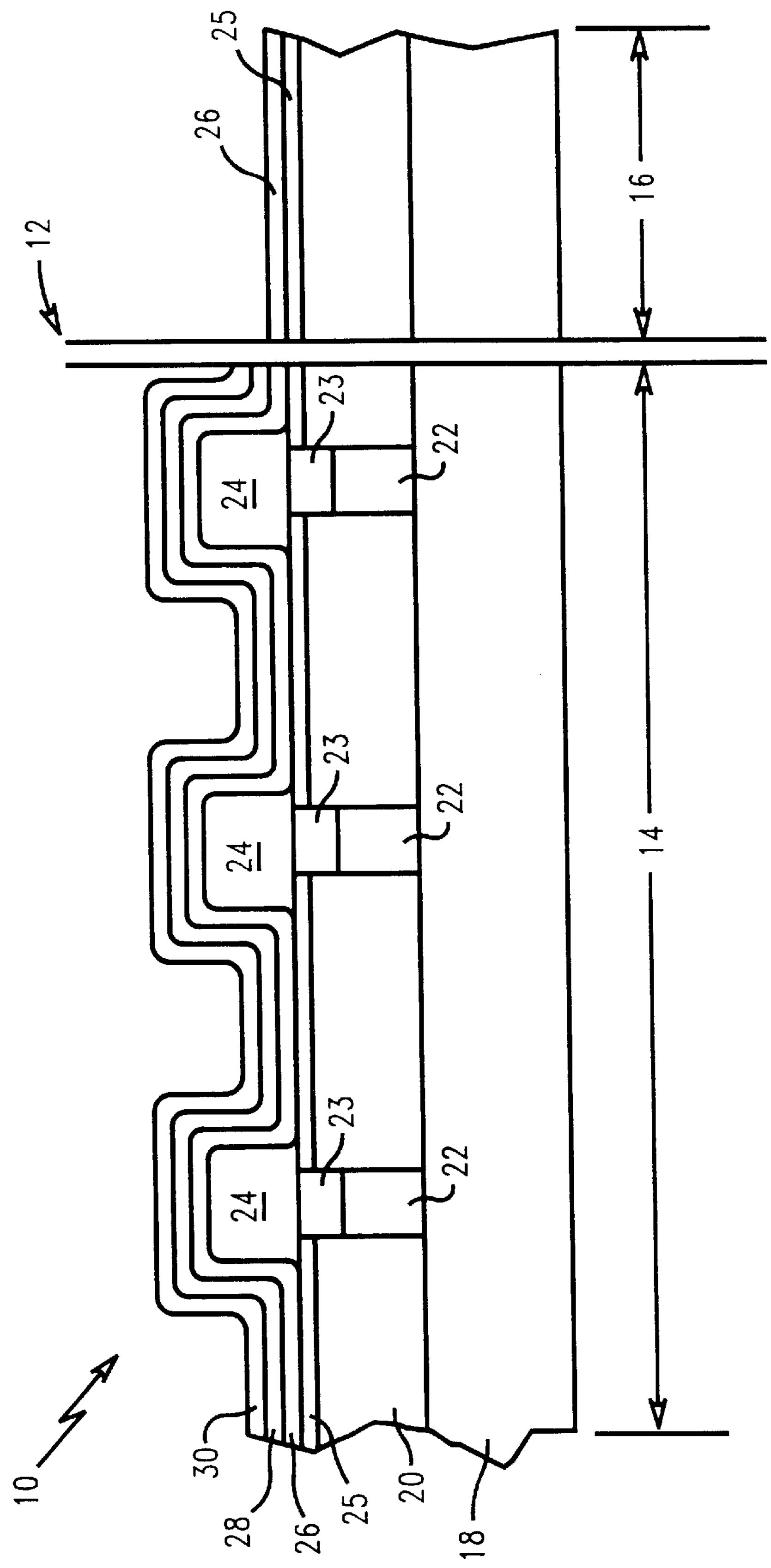
FIG. 2 is a cross-sectional view of the precursor cell stacked structure of FIG. 1 subsequent to etching of the top electrode, however, prior to etching using the process and solution of the present invention.

As shown in FIG. 1, a typical precursor cell stacked structure for a DRAM device is generally designated 10. The structure 10 is separated, by a double line 12, into an array area 14 and a field area 16. The structure 10 has a silicon substrate layer 18 and a silicon oxide or silicon nitride substrate layer 20, with polysilicon contact plugs 22, on the layer 18. The other layers are then deposited through conventional methods such as vacuum deposition, PVD or CVD, epitaxial growth and the like. The structure 10 has a patterned bottom electrode layer 24 which is usually composed of platinum. Diffusion barrier layers 23 and 25 are disposed respectively between the contact plugs 22 and the bottom electrode layer 24 and the layer 20 and a ferroelectric perovskite material layer 26. The barrier layer 25 may be, for example, a layer of SiNx or $SiO_2$. The ferroelectric perovskite material is deposited as the layer 26 onto the bottom electrode layer 24. A preferred ferroelectric perovskite material is BSTO. However, the ferroelectric perovskite material alternatively could be barium titanate, strontium titanate, calcium titanate, lead titanate, lead lanthanum zirconium titanate or lead zirconium titanate. The ferroelectric perovskite material covers the entire patterned bottom electrode layer 24 and areas in between. The top electrode layer 28 is deposited onto the ferroelectric perovskite material layer 26. The top electrode layer is preferably composed of platinum. A mask and cover layer 30 is selectively deposited onto the top electrode layer 28. The mask layer 30 is preferably titanium nitride or silicon oxide, and its patterned deposition dictates the etching of the top electrode layer 28. The top electrode layer 28 is etched with an appropriate etchant for platinum to produce the structure shown in FIG. 2. As can be seen, because there is no mask layer 30 in the field area 16, the top electrode layer 28 is removed in the field area 16.

After the top electrode etching, the structure 10 will have an etched top electrode layer 28 with portions of the ferroelectric perovskite material layer 26 exposed for wet etching with the process and solution of the present invention. The top electrode layer 28 can act as a mask. The precursor structure 10 of FIG. 2 will be placed within a bath of the solution of the present invention for a predetermined time period depending on the thickness of the ferroelectric perovskite material layer 26 and its composition. The time period may range from 30 to 1000 seconds or longer. The hydrogen peroxide is present in the solution from between 20% to 95% concentration, the acid is present from about 5% to 80% concentration and the deionized water is present from 0% to 75%. In a preferred embodiment, the solution is 45% hydrogen peroxide, 10% sulfuric acid and 45% deionized water. The solution is heated to a temperature of between 25 and 90 degrees Celsius. The temperature of the solution and the etch time will vary depending on the thickness of the ferroelectric perovskite material layer 26 and its composition.

Figure 3:
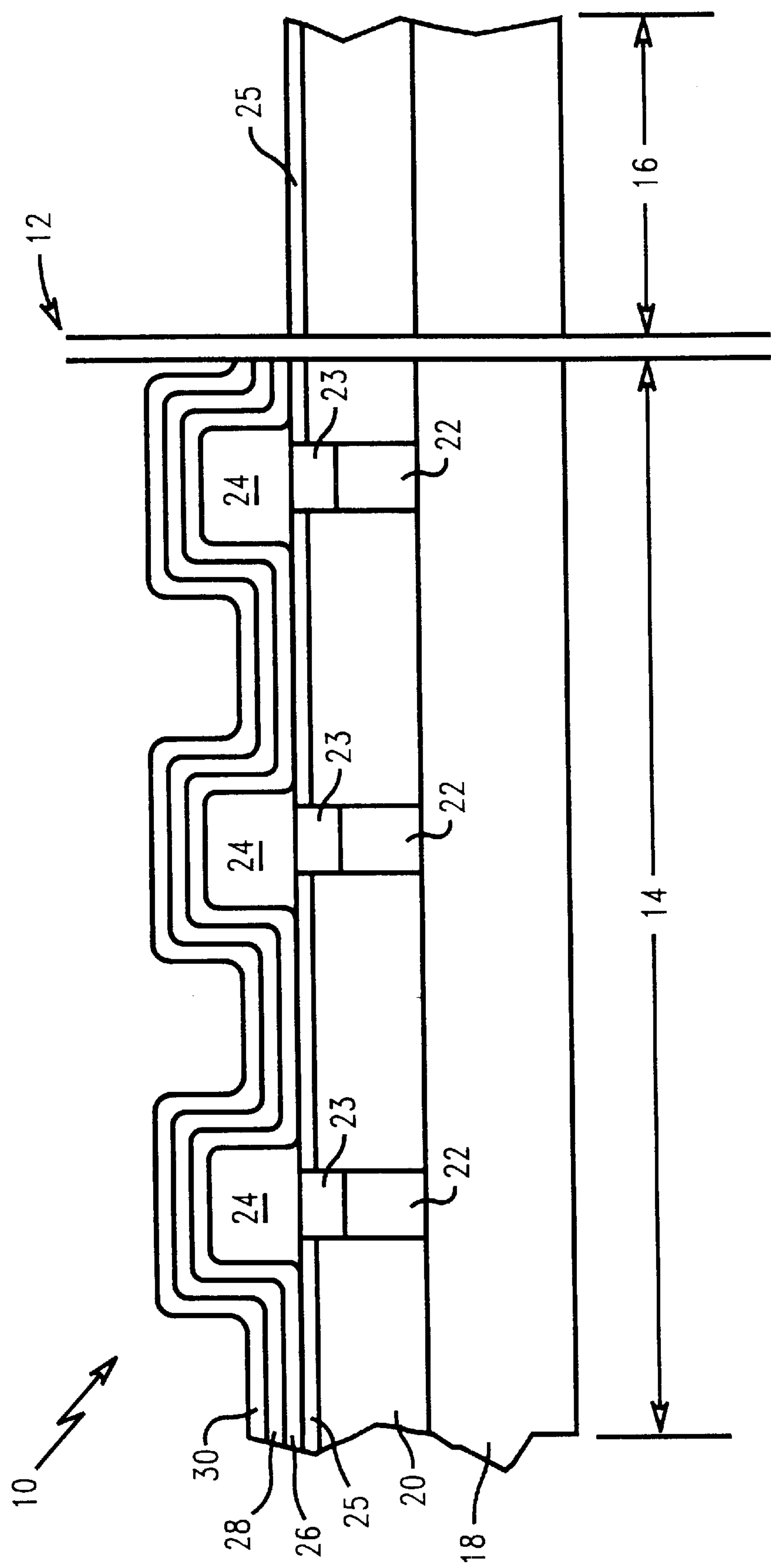
FIG. 3 is a cross-sectional view of the precursor cell stacked structure of FIG. 1 subsequent to etching of the ferroelectric perovskite material using the process and solution of the present invention.

FIG. 3 illustrates the structure 20 subsequent to the wet etching process and solution of the present invention. The ferroelectric perovskite material layer 26 has a predetermined pattern, corresponding to that of the electrode layers 24 and 28, wherein the exposed areas have been removed by the process and solution of the present invention. Also, the wet etching process and solution will not substantially effect the other layers, that is the other layers will not be etched by the wet etching process and solution of the present invention. After the ferroelectric perovskite material layer 26 has been etched, a cover layer may be deposited onto the ferroelectric perovskite material layer 26 during further processing of the structure 10. The cover layer, not shown, may be oxide to act as a protective coating for the exposed areas including the ferroelectric perovskite material layer 26.

Figures 4, 5:
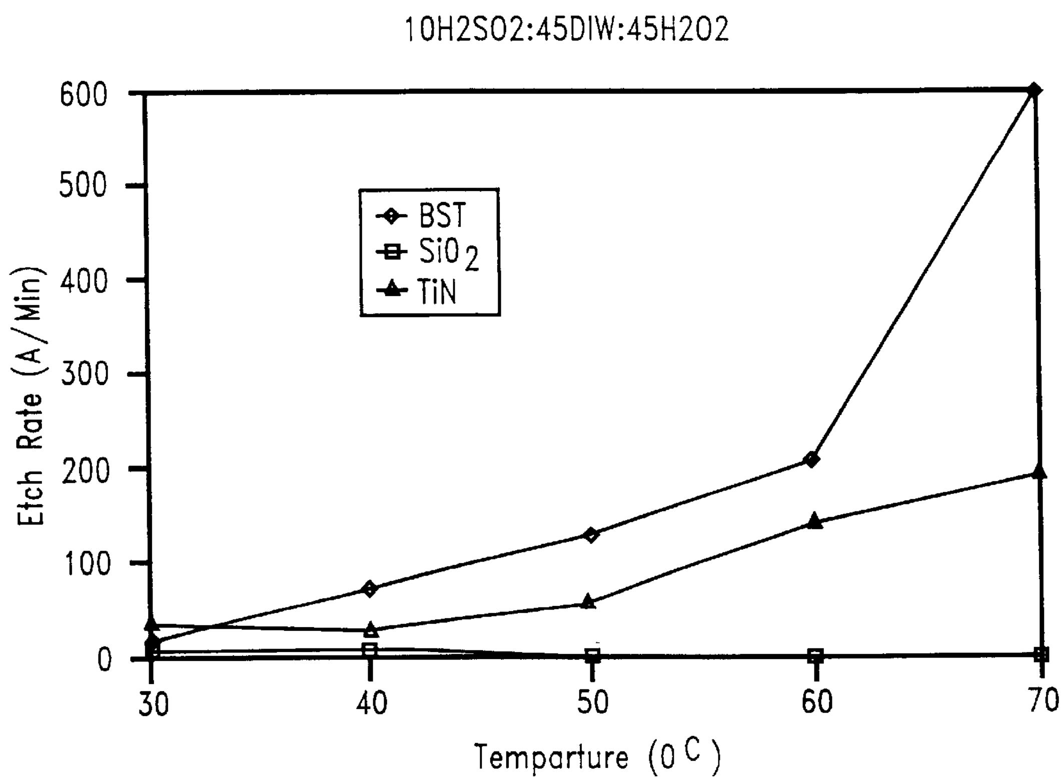
FIG. 4 is a graph of the etching rate versus temperature of the present invention for BSTO, silicon oxide and titanium nitride.
FIG. 5 is a table illustrating the selectivity of the wet etching process and solution of the present invention.

The etching rate for BSTO, titanium nitride and silicon oxide, when subjected to the wet etching process and solution of the present invention, are illustrated in FIG. 4. As shown in FIG. 4, the wet etching process solution of the present invention minimally etches titanium nitride and silicon oxide while providing a tremendous etching rate for BSTO, an etching rate that is thirty times greater than some conventional etching methods. Of note is the fact that the etching rate for BSTO increases as the temperature of the solution is increased toward 70 degrees Celsius. Thus, at 50 degrees Celsius, the etching rate is approximately 100 Angstroms per minute while at 70 degrees Celsius the etching rate increases to over 600 Angstroms per minute. The etching rate for the silicon oxide remains low at any temperature indicating the selectivity of the wet etching process and solution of the present invention. However, the etching rate of the titanium nitrate also increases with increases in the temperature of the solution.

FIG. 5 further illustrates the selectivity of the wet etching process and solution of the present invention. The columns correspond to temperature changes.

Figure 6:
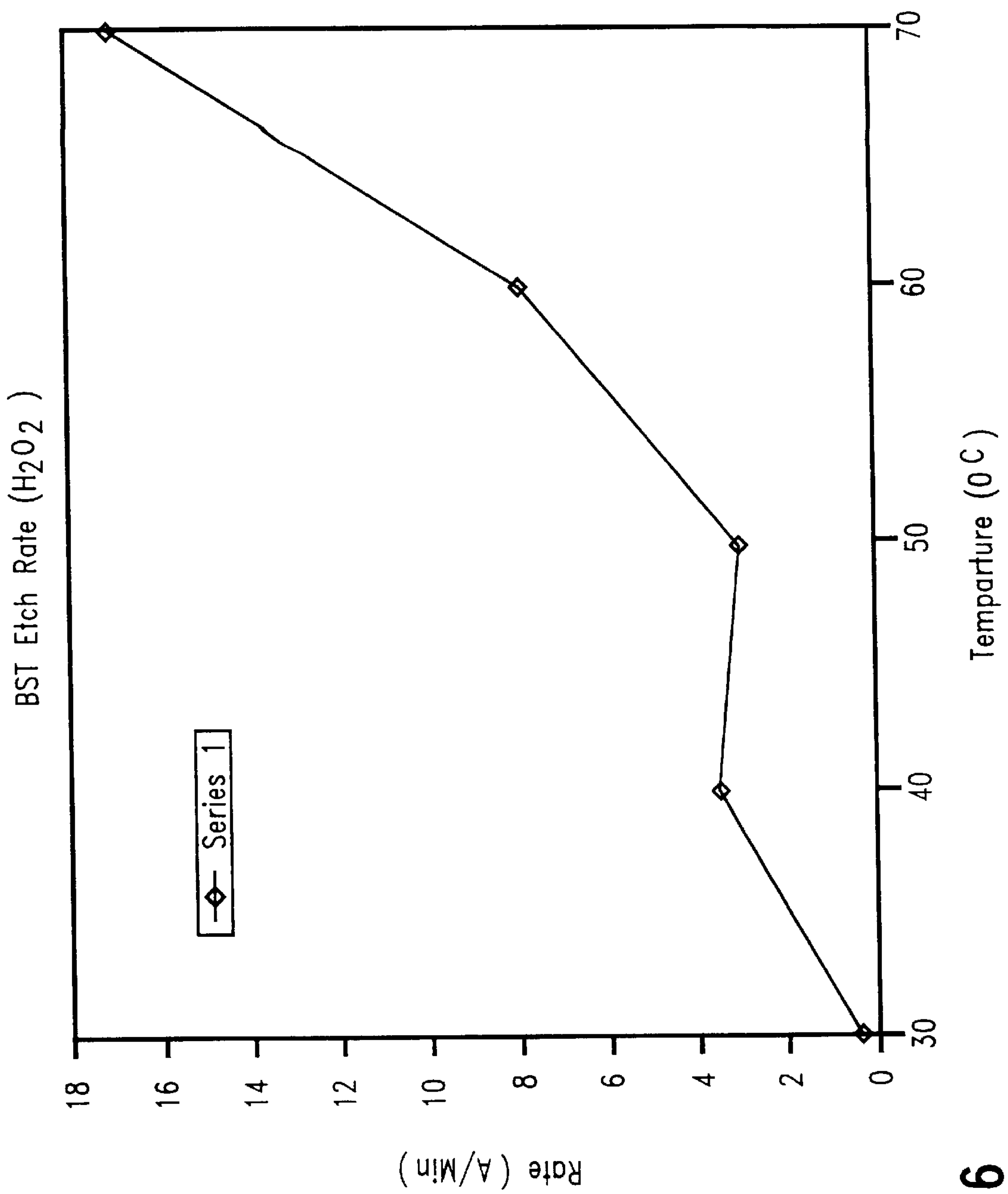
FIG. 6 is a graph of the etching rate versus temperature for a solution of only hydrogen peroxide for BSTO, silicon oxide and titanium nitride.

FIG. 6 is a graph of the etching rate of BSTO, when subjected to only hydrogen peroxide at various temperatures. As illustrated in FIG. 6, the etch rate is substantially slower than the etch rate of the wet etching process and solution of the present invention. Thus, even at 70 degrees Celsius, the etch rate for a solution of only hydrogen peroxide is only eighteen Angstroms per minute.

Figure 7:
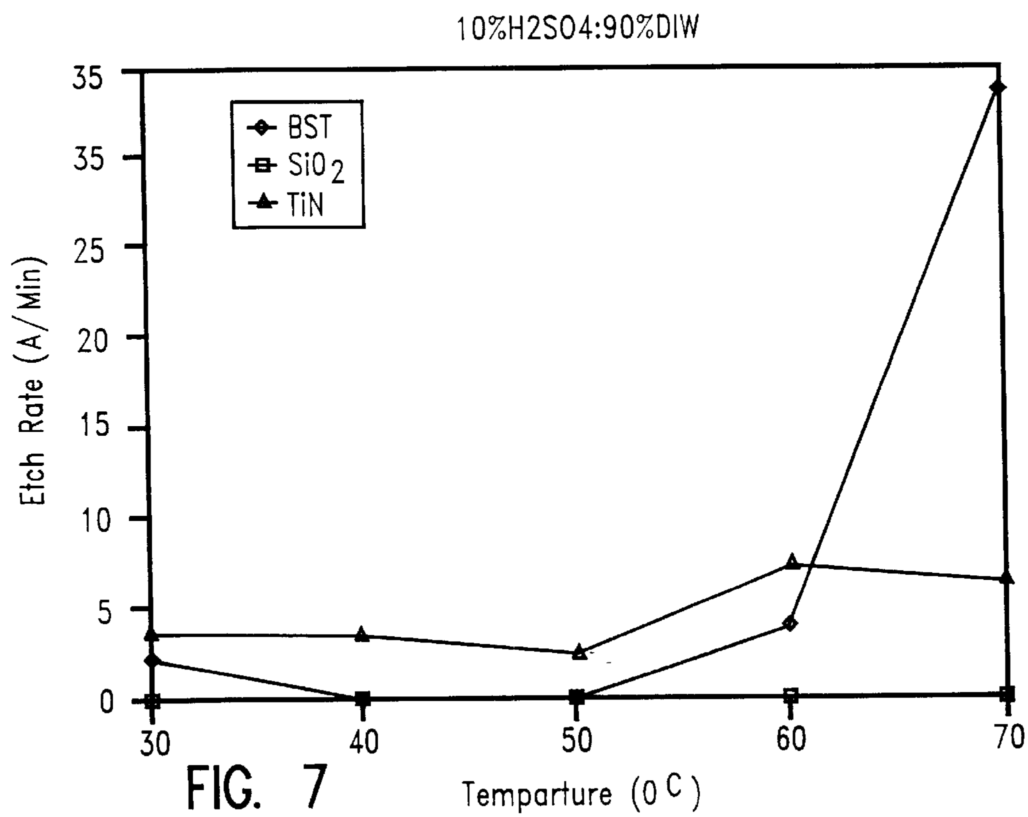
FIG. 7 is a graph of the etching rate versus temperature for a solution of only sulfuric acid at a first concentration for BSTO, silicon oxide and titanium nitride.
Figure 8:
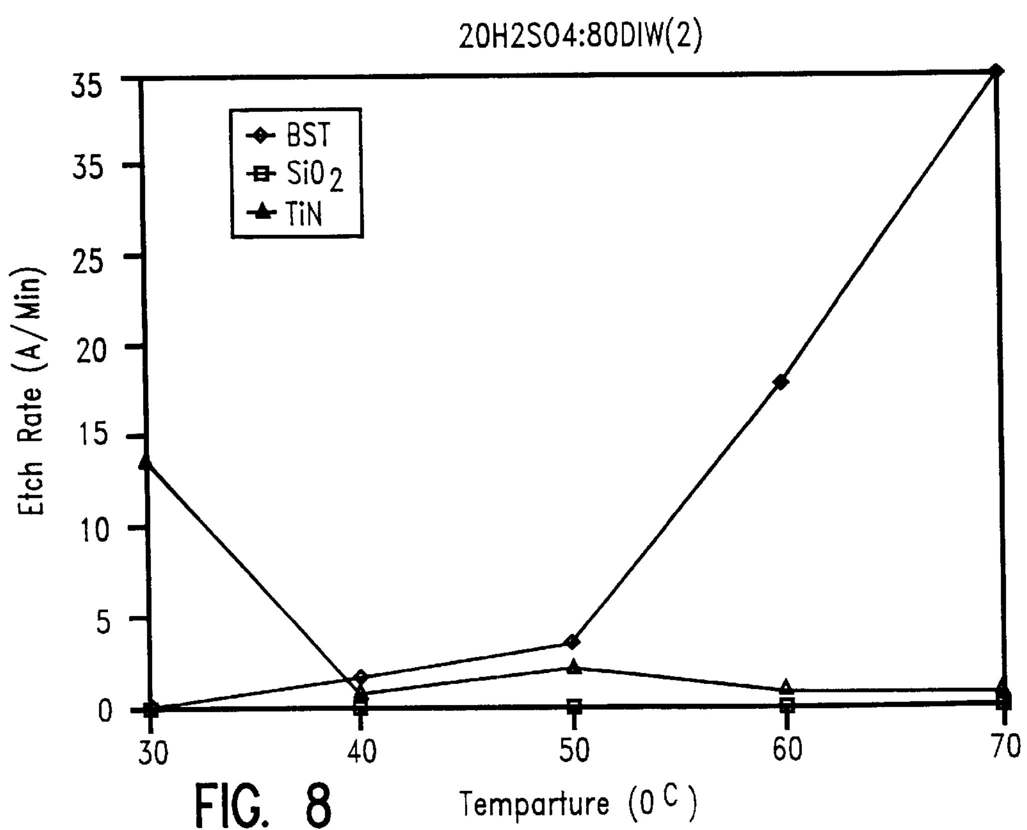
FIG. 8 is a graph of the etching rate versus temperature for a solution of only sulfuric acid at a different concentration for BSTO, silicon oxide and titanium nitride.

FIGS. 7 and 8 are graphs of the etching rate of BSTO, titanium nitride and silicon oxide, when subjected to only acid and deionized water at various temperatures. The solution of FIG. 7 has a 10% concentration of sulfuric acid while the solution of FIG. 8 has a 20% concentration of sulfuric acid. As illustrated in FIGS. 7 and 8, the etch rate is substantially slower than the etch rate of the wet etching process and solution of the present invention. Thus, at 70 degrees Celsius, the etch rate for both sulfuric acid solutions is only thirty-five Angstroms per minute.

From the foregoing it is believed that those skilled in the pertinent art will recognize the meritorious advancement of this invention and will readily understand that while the present invention has been described in association with a preferred embodiment thereof, and other embodiments illustrated in the accompanying drawings, numerous changes, modifications and substitutions of equivalents may be made therein without departing from the spirit and scope of this invention which is intended to be unlimited by the foregoing except as may appear in the following appended claims.

We claim:

1. A process for etching a perovskite ferroelectric material, the process comprising:

providing a substrate having a ferroelectric film with a select portion of the ferroelectric film being covered by a mask layer and another portion of the ferroelectric film being exposed, the ferroelectric film composed of a perovskite material and the mask layer being selected from titanium nitride or silicon oxide;

subjecting the substrate to a mixture of hydrogen peroxide and an acid, wherein the acid is selected from the group consisting of sulfuric acid, hydrochloric acid, phosphoric acid and acetic acid; and heating the mixture to a temperature between 30 and 90 degrees Celsius.

2. The process according to claim 1 wherein the perovskite material is selected from the group consisting of barium strontium titanate, barium titanate, strontium titanate, calcium titanate, lead titanate, lead lanthanum zirconium titanate and lead zirconium titanate.

3. The process according to claim 1 wherein the mixture is composed of between approximately 20% to approximately 95% volume of hydrogen peroxide, 5% to 80% volume acid, and 0% to 75% volume deionized water.

4. The process according to claim 1 wherein the mixture is composed of approximately 45 percent volume hydrogen peroxide, approximately 10 percent volume acid and approximately 45 percent volume deionized water.

5. The process according to claim 1 wherein the step of subjecting the ferroelectric film to the mixture comprises placing the substrate with the ferroelectric film disposed thereon into a solution of the mixture for a predetermined time period to effect the necessary etching of the ferroelectric film.

6. The process according to claim 5 wherein the predetermined time period is between 30 and 1000 seconds.

7. A process for etching a perovskite ferroelectric material, the process comprising:

providing a substrate having a ferroelectric film composed of a perovskite material selected from the group consisting of barium strontium titanate, barium titanate, strontium titanate and lead titanate, the substrate also having a silicon oxide or titanium nitride component and an electrode;

subjecting the substrate having the ferroelectric film to a solution comprising hydrogen peroxide and sulfuric acid; and heating the solution to a temperature between 25 and 90 degrees Celsius.

8. The process according to claim 7 wherein the electrode is composed of platinum.

9. The process according to claim 7 wherein the solution is composed of between approximately 20% to approximately 95% volume of hydrogen peroxide, 5% to 80% volume sulfuric acid, and 0% to 75% volume deionized water.

10. The process according to claim 7 wherein the solution is heated to a temperature between 30 and 70 degrees Celsius.

11. The process according to claim 7 wherein the step of subjecting the substrate having a ferroelectric film to the solution comprises placing the substrate having the ferroelectric film a bath of the solution for a predetermined time period to effect the necessary etching of the ferroelectric film.

12. The process according to claim 11 wherein the predetermined time period is between 30 and 1000 seconds.

* * * * *